United States Patent [19]
Ohara et al.

[11] Patent Number: 5,668,033
[45] Date of Patent: Sep. 16, 1997

[54] METHOD FOR MANUFACTURING A SEMICONDUCTOR ACCELERATION SENSOR DEVICE

[75] Inventors: Fumio Ohara, Okazaki; Shinji Yoshihara, Nagoya; Katuhiko Kanamori, Nukata-gun; Takashi Kurahashi, Okazaki, all of Japan

[73] Assignee: Nippondenso Co., Ltd., Kariya, Japan

[21] Appl. No.: 648,968

[22] Filed: May 17, 1996

[30] Foreign Application Priority Data

May 18, 1995 [JP] Japan ................ 7-120138

[51] Int. Cl.$^6$ ................................ H01L 21/304
[52] U.S. Cl. ................ 438/113; 438/33; 438/50; 438/52; 438/456; 438/458
[58] Field of Search ................ 437/51, 226, 227, 437/901, 927, 974; 148/DIG. 12, DIG. 28

[56] References Cited

U.S. PATENT DOCUMENTS

| | | | |
|---|---|---|---|
| 5,006,487 | 4/1991 | Stokes | 148/DIG. 12 |
| 5,216,490 | 6/1993 | Greiff et al. | 257/415 |
| 5,310,450 | 5/1994 | Offenberg et al. | 437/901 |
| 5,326,726 | 7/1994 | Tsang et al. | 437/927 |
| 5,329,110 | 7/1994 | Shimabukuro et al. | 437/927 |

FOREIGN PATENT DOCUMENTS

| | | |
|---|---|---|
| 53-119694 | 10/1978 | Japan . |
| 5-326738 | 12/1993 | Japan . |
| 5-326740 | 12/1993 | Japan . |
| 5-326702 | 12/1993 | Japan . |

*Primary Examiner*—Chandra Chaudhari
*Attorney, Agent, or Firm*—Cushman, Darby & Cushman IP Group of Pillsbury Madison & Sutro LLP

[57] ABSTRACT

On a silicon wafer there is formed a movable gate MOS transistor (sensing element: functional element). A bonding frame consisting of a silicon thin film is patterned around an element formation region on the surface of the silicon wafer. On a cap forming silicon wafer there is projectively provided a leg portion on the bottom surface of which a bonding layer consisting of a gold film is formed. The cap forming silicon wafer is disposed on the silicon wafer, whereupon heating with respect thereto is performed at a temperature equal to higher than a gold/silicon eutectic temperature to thereby make bondage between the bonding frame of the silicon wafer and the bonding layer of the cap forming silicon wafer. Thereafter, the both wafers are diced in chip units.

20 Claims, 14 Drawing Sheets

SCRIBE LINE
PERIPHERAL CIRCUIT REGION
BONDING FRAME
SENSING ELEMENT FORMATION REGION

METHOD FOR MANUFACTURING A SEMICONDUCTOR ACCELERATION SENSOR DEVICE

CROSS REFERENCE TO RELATED APPLICATION

This application is based upon and claims the benefit of priority of the prior Japanese Patent Application No. 7-120138 filed on May 18, 1995, the contents of which are incorporated herein by reference.

BACKGROUND OF THE INVENTION

1. Field of the Invention

The present invention relates to a method for manufacturing a semiconductor device having a protective cap for covering a functional element.

2. Related Arts

Conventionally, a semiconductor acceleration sensor has a movable portion on its silicon chip, whereby a physical quantity such as an acceleration is converted to an electric signal by displacement of the movable portion, which electric signal is then taken out. Also, in such a semiconductor device, it is performed to cover the movable portion by a cap in order to protect this movable portion.

As a method for manufacturing a semiconductor device wherein the movable portion is covered by the cap as mentioned above, there is that disclosed in Published Unexamined Japanese Patent Application No. H-5-326702. In this method, a plurality of sensors are formed on a silicon substrate and thereafter caps for protecting the sensors are bonded on the silicon substrate. Then, the silicon substrate and cap are cut while being simultaneously exposed to a water flow. And finally, lead wires are connected to the outside via the through openings for electrode leads formed beforehand in the silicon substrate.

However, in the method for manufacturing a semiconductor device disclosed in Published Unexamined Japanese Patent Application No. H-5-326702, pads connected to the sensor are disposed within the cap. Therefore, in order to make wire connection with the pads, it is necessary to form the through openings in the silicon substrate or cap as mentioned above. As a result, the process steps for the formation of the through openings does not only increase but does the water flow during the cutting step also inconveniently enter into the caps, raising the problem that the productivity decreases.

SUMMARY OF THE INVENTION

Primary object of the present invention is to provide a method for manufacturing a semiconductor device, which in a method for manufacturing a semiconductor device covering a movable portion by use of a cap eliminates the necessity of forming through openings in the semiconductor substrate or cap, enables easy wire connection with the outside and does not decrease in productivity.

The manufacturing method according to the present invention comprises, when providing a cap with respect to a plurality of functional elements (each becoming a functional element in the chip) formed in the semiconductor wafer, a functional element forming step of forming pads for making wire connection between each functional element and the outside, between a functional element forming region and a predetermined region of the semiconductor wafer at which this semiconductor wafer is to be divided, a bonding frame forming step of forming a bonding frame surrounding each functional element in a region around each functional element on the surface of the semiconductor wafer and on a side nearer to each functional element than to the pad, and a bonding step of bonding a cap forming wafer having a leg portion at a position corresponding to the bonding frame, onto the semiconductor wafer by making bondage between the leg portion and the bonding frame. The manufacturing method further comprises a cutting step wherein the semiconductor wafer is cut at the predetermined region thereof where it is to be divided and also the cap forming wafer is cut at a cutting position on a side nearer to the bonding frame than to the position that opposes the pad.

Since the pad is formed as mentioned above between the position on the surface of the semiconductor wafer where the bonding frame is formed and the predetermined position thereon where the semiconductor wafer is to be divided, the pad is formed on the outside of the cap with the result that wire connection with the outside can be performed easily. Accordingly, there is no need to form a through opening in the semiconductor wafer or cap. This enables the procurement of a method for manufacturing a semiconductor device, wherein no decrease occurs in the productivity.

Also, preferably, a gold (Au) film is adhered to the leg portion of the cap forming wafer. Where the bonding frame is made to be formed using silicon (Si), when in the bonding step heating is performed up to a temperature higher than an Au/Si eutectic temperature, the gold film comes to function as a bonding layer, with the result that it is possible to obtain a tough bondage easily. Further, when the gold film is also adhered onto the inner surface of the cap, the gold film can be also made to function as an electromagnetic shielding layer.

Also, when in the formation of a thin film structure in the functional element the bonding frame is formed using the same material as that of which the thin film structure is formed, the thin film structure of the functional element and the bonding frame can be simultaneously disposed in highly precise positional relationship with respect to each other through mere patterning of the thin film alone. As a result, enhancement of the productivity can be achieved with no increase in the process steps.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A first embodiment of a semiconductor acceleration sensor which has embodied the present invention will now be explained with reference to the drawings.

Figure 1:
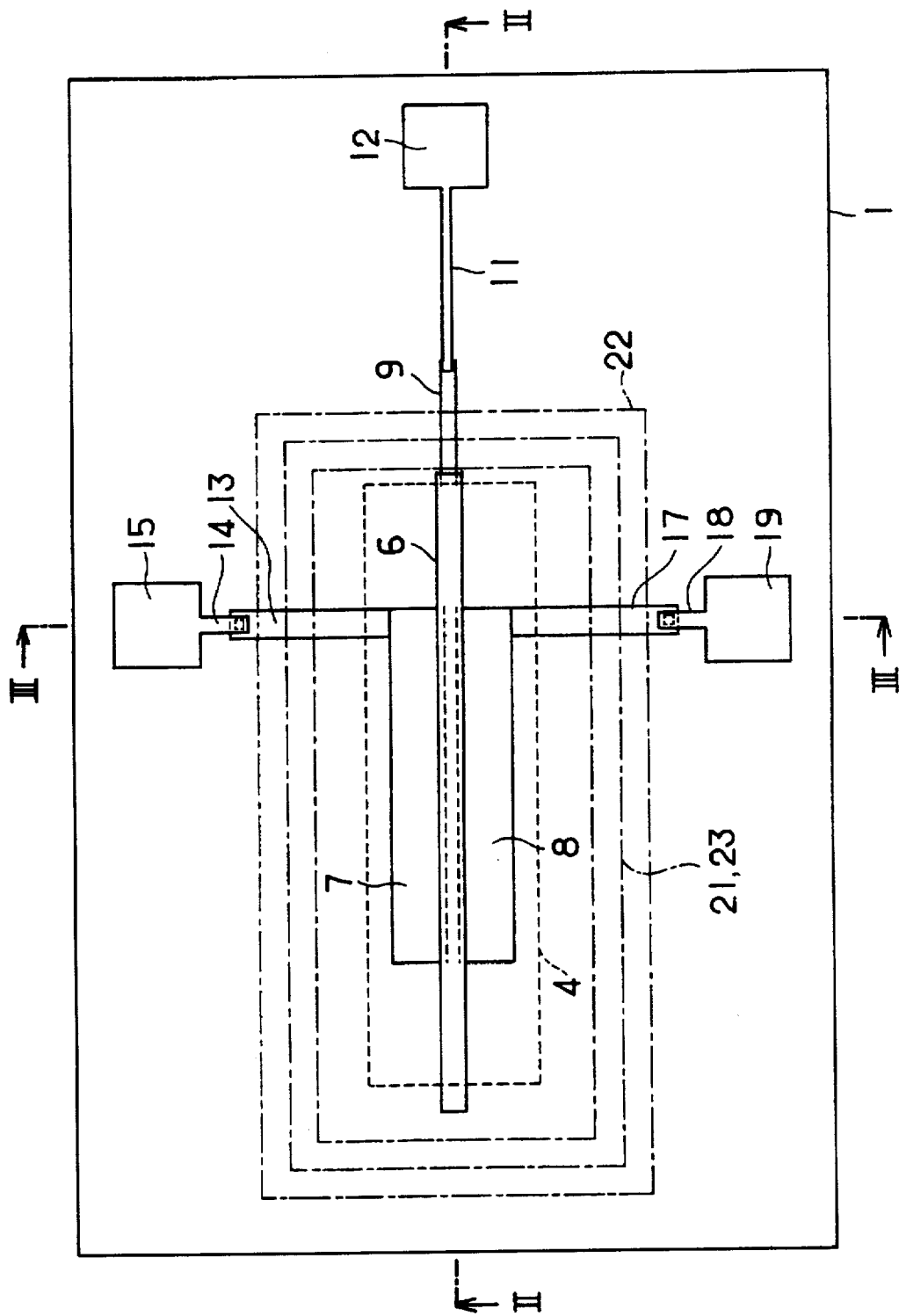
FIG. 1 is a plan view illustrating a semiconductor sensor chip according to a first embodiment of the present invention.

FIG. 1 is a plan view illustrating a movable gate MOS transistor type acceleration sensor according to this embodiment. Also, FIG. 2 illustrates a section taken along the line II—II of FIG. 1 and FIG. 3 illustrates a section taken along the line III—III of FIG. 1.

On a P-type silicon substrate 1 serving as a semiconductor substrate there is formed a field oxide film 2 on which there is formed a nitride silicon film 3. Also, on the P-type silicon substrate there is formed a rectangular region 4 having the field oxide film 2 and silicon nitride film 3 not formed therein. Also, on the P-type silicon substrate 1 within the region 4, a gate insulation film 5 is formed. On the silicon nitride film 3 there is disposed a movable gate electrode 6 of a bridged beam structure in such a manner that this gate electrode 6 is bridged over the region 4. The movable gate electrode 6 consists of a polysilicon thin film linearly extending in the form of a strip. Also, the P-type silicon substrate 1 and the movable gate electrode 6 are insulated from each other by means of the field oxide film 2 and the silicon nitride film 3.

Figure 3:
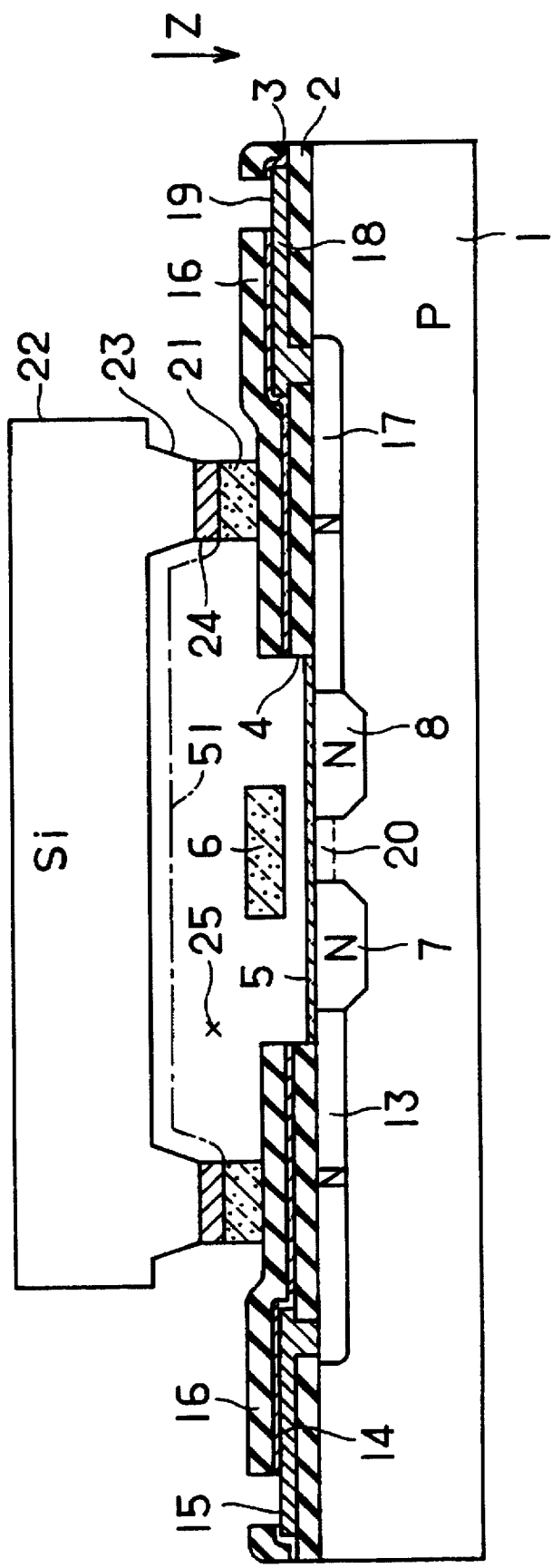
FIG. 3 is a sectional view taken along the line III—III of FIG. 1.

In FIG. 3, a fixed source electrode 7 and a fixed drain electrode 8 that consist respectively of impurity diffusion layers are formed on both sides of the movable gate electrode 6 on the P-type silicon substrate 1 and each of these electrodes 7 and 8 is one formed by ion implantation or the like of an N-type impurity into the P-type silicon substrate 1.

Figure 2:
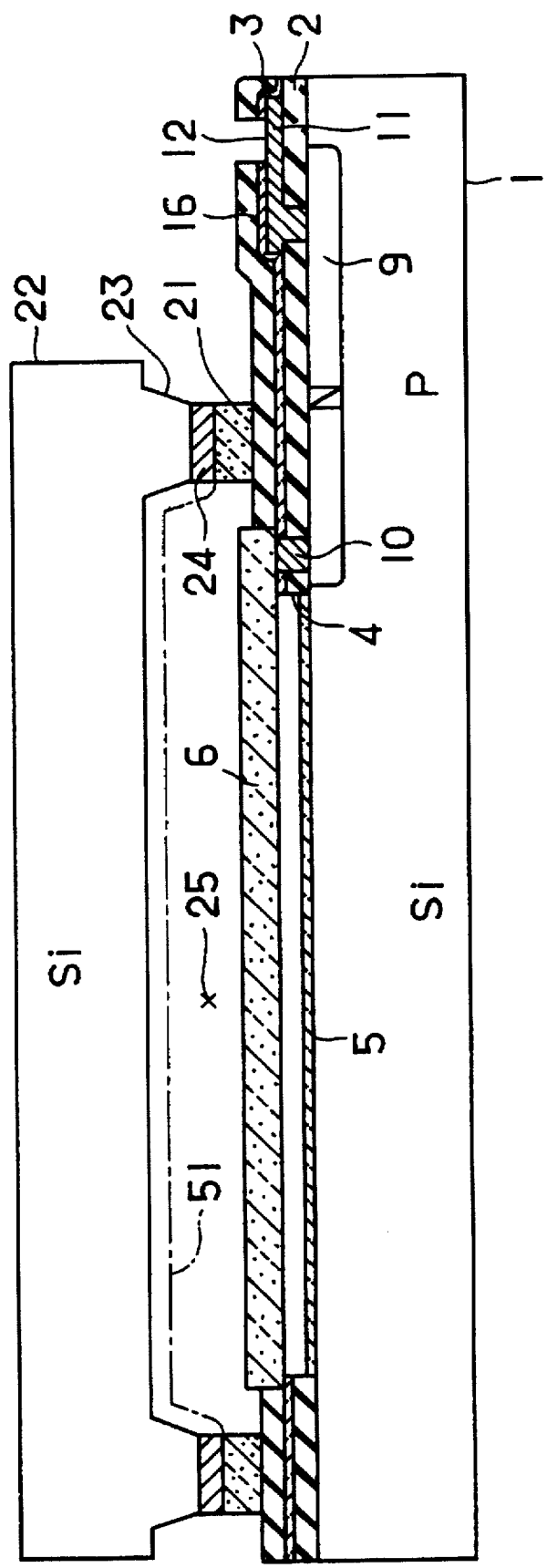
FIG. 2 is a sectional view taken along the line II—II of FIG. 1.

As illustrated in FIG. 2, an N-type impurity diffusion region 9 is extended in the P-type silicon substrate 1. The N-type impurity diffusion region 9 is connected to the movable gate electrode 6 by aluminum 10 and is also electrically connected to an aluminum wiring 11. The other end of the aluminum wiring 11 is exposed from the silicon nitride film 3 and a silicon oxide film 16 and serves as an aluminum pad (electrode pad) 12. Also, as illustrated in FIG. 3, an N-type impurity diffusion region 13 is extended in the P-type silicon substrate 1. The N-type impurity diffusion region 13 is connected to the fixed source electrode 7 and also is electrically connected to an aluminum pad 14. The other end of the aluminum wiring 14 is exposed from the silicon nitride film 3 and the silicon oxide film 16 and serves as an aluminum pad (electrode pad) 15. Further, an N-type impurity diffusion region 17 is extended in the P-type silicon substrate 1. The N-type impurity diffusion region 17 is connected to the fixed drain electrode 8 and also is electrically connected to an aluminum pad 18. The other end of the aluminum wiring 18 is exposed from the silicon nitride film 3 and the silicon oxide film 16 and serves as an aluminum pad (electrode pad) 19.

Note here that as described later a silicon nitride film becoming a final protective film is further formed on the silicon oxide film 16 over a region thereof excluding that corresponding to the movable gate electrode 6.

Also, aluminum pads 12, 15 and 19 are connected to an external circuit by means of bonding wires.

As illustrated in FIG. 3, an inversion layer 20 is formed between the fixed source electrode 7 and the fixed drain electrode 8 in the P-type silicon substrate 1. This inversion layer 20 is one which has occurred through application of a voltage across the silicon substrate 1 and the movable gate electrode (bridged beam electrode) 6.

When in acceleration detection a voltage is applied between the movable gate electrode 6 and the silicon substrate 1, the inversion layer 20 is formed, whereby an electric current flows between the fixed source electrode 7 and the fixed drain electrode 8. And when the present acceleration sensor has been subjected to acceleration whereby the movable gate electrode 6 has changed in a Z direction (direction orthogonal to the surface of the substrate) indicated in FIG. 3, the carrier concentration in the inversion layer 20 increases due to a change in the electric field intensity, with the result that the current (drain current) increases. As mentioned above, in the present acceleration sensor, a sensing element (movable gate MOS transistor) serving as a functional element is formed on the surface of the silicon substrate 1 and it is possible to detect the acceleration by an increase or decrease in the quantity of the current.

On the silicon oxide film 16, a bonding frame 21 consisting of a polysilicon thin film is formed around a sensing element forming region. As illustrated in FIG. 1, the bonding frame 21 is disposed in the form of an annulus (more specifically, a square annulus). Aluminum pads (electrode pads) 12, 15 and 19 are disposed around and near the bonding frame 21.

A cap 22 consists of a square-shaped silicon substrate and an annular leg portion 23 is provided on the underside of this cap 22. The leg portion 23 is formed by locally etching the silicon substrate. A bonding layer 24 is formed on a forward end surface (underside) of the leg portion 23. The bonding layer 24 consists of a gold (Au) plating film. The bonding layer (Au film) 24 and the bonding frame 21 are bonded to each other. Namely, this bonding is effected by forming an Au-Si alloy layer. More specifically, this bonding is effected by a eutectic reaction occurring through heating the bonding frame (polysilicon thin film) 21 and the bonding layer (Au film) 24 up to a temperature higher than an Au/Si eutectic temperature of 363° C.

As mentioned above, by bonding the cap 22 having the bonding layer 24 formed thereon with respect to the bonding frame 21, a structure is provided wherein the sensing element (movable gate MOS transistor) has been sealed within a spatial zone 25 in the cap 22 on the surface of the silicon substrate 1.

Next, an explanation will be given of process steps for the formation of a sealed structure using the cap 22.

First, the process steps for the formation of the bonding frame 21 will be explained with reference to FIGS. 4 through 8. Note that although in the case of this embodiment in addition to the sensing portion (movable gate electrode 6) a control circuit therefor, etc. are sometimes formed simultaneously, the explanation will be given with process steps therefor being omitted.

Figure 4:
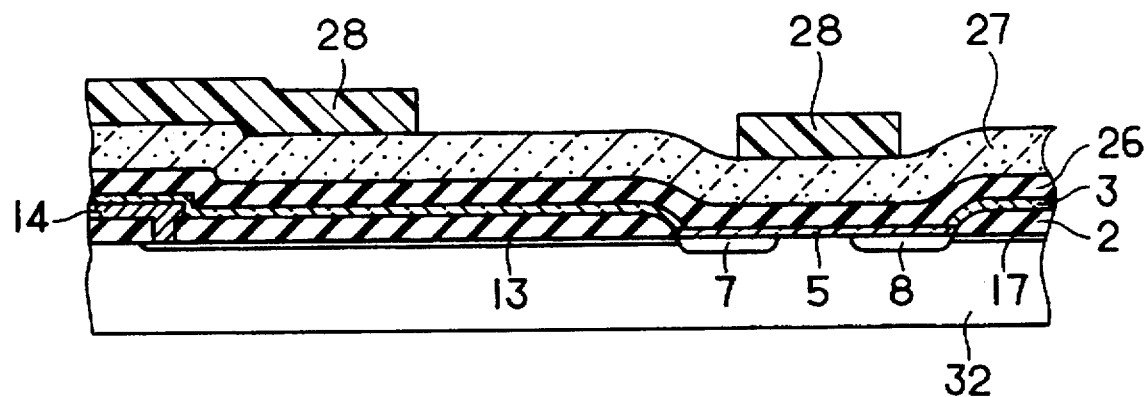
FIGS. 4 through 8 are sectional views illustrating main components of a sensing element forming side wafer in the order of the manufacturing process steps.

First, as illustrated in FIG. 4, the field oxide film 2, gate insulation film 5, impurity diffusion layers (fixed source electrode 7, fixed drain electrode 8, and diffusion regions 9, 13 and 17), draw-out aluminum wiring 14, etc. are formed, whereupon a silicon nitride film 3 becoming an etching stopper is further patterned. A silicon oxide film 26 becoming a sacrifice etching layer is formed thereon and patterned into a desired configuration. Then, a polysilicon thin film 27 which becomes the movable gate electrode and bonding frame is deposited thereon and then a photoresist 28 is disposed.

Figure 5:
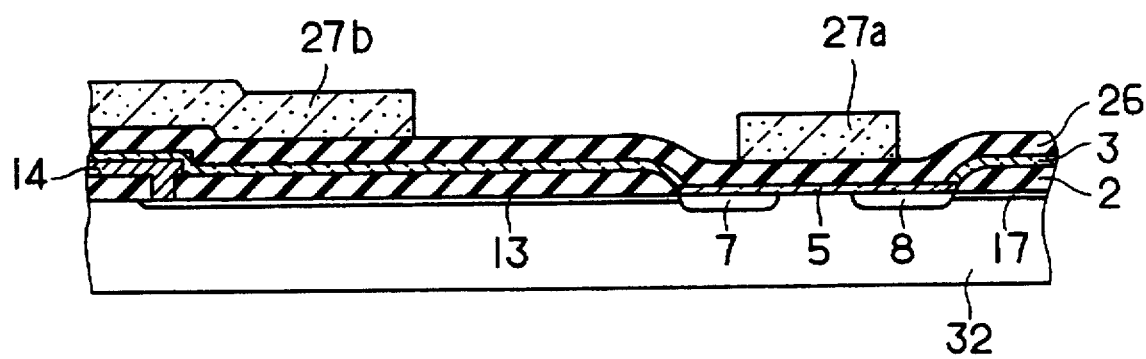

Further, as illustrated in FIG. 5, the polysilicon thin film 27 is patterned by ordinary photolithography to thereby dispose a polysilicon thin film 27a in the movable gate electrode forming region and also dispose a polysilicon thin film 27b in the bonding frame forming region (a region on the surface of the wafer extending around the sensing element forming region thereof). At this time, the polysilicon thin film 27b in the bonding frame forming region is disposed being spaced by a necessary minimum distance from the polysilicon thin film 27a in the movable gate electrode forming region.

Figure 6:
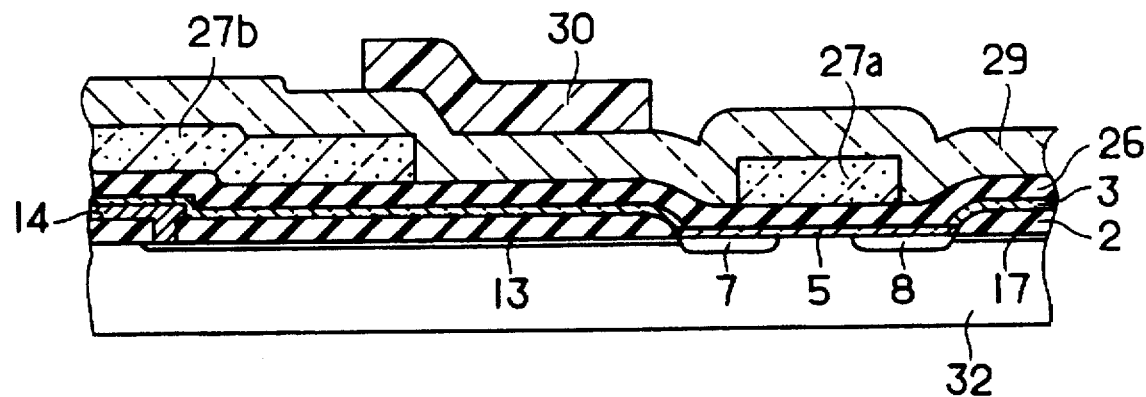
Figure 7:
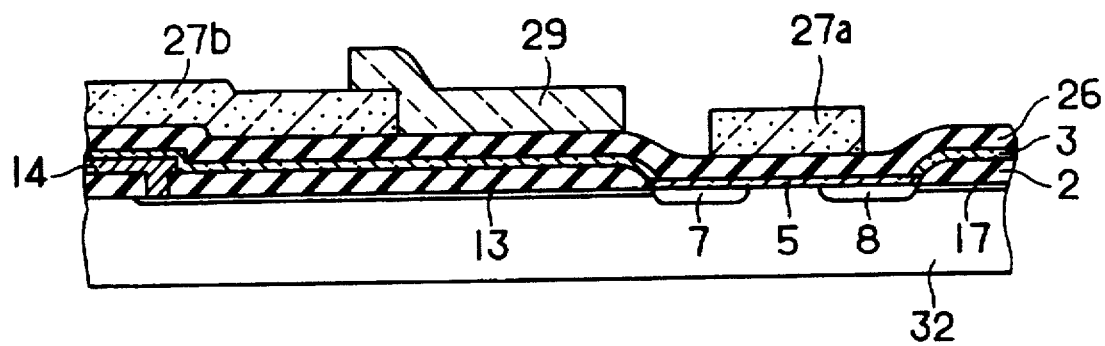

Subsequently, as illustrated in FIG. 6, an insulating film 29 (e.g., a silicon nitride film prepared by use of a plasma CVD technique) becoming a final protective film for protection of the IC chip is formed on the silicon wafer 32 and, in order to perform patterning of the insulating film 29 so as to protect other regions than a region in the proximity of the movable gate electrode forming region, bonding frame forming region and, although not illustrated, aluminum pad portions of the IC chip, a photoresist 30 is formed on the insulating film 29. Then, as illustrated in FIG. 7, only the relevant insulating film 29 alone is left as is by use of the photoresist 30.

Figure 8:
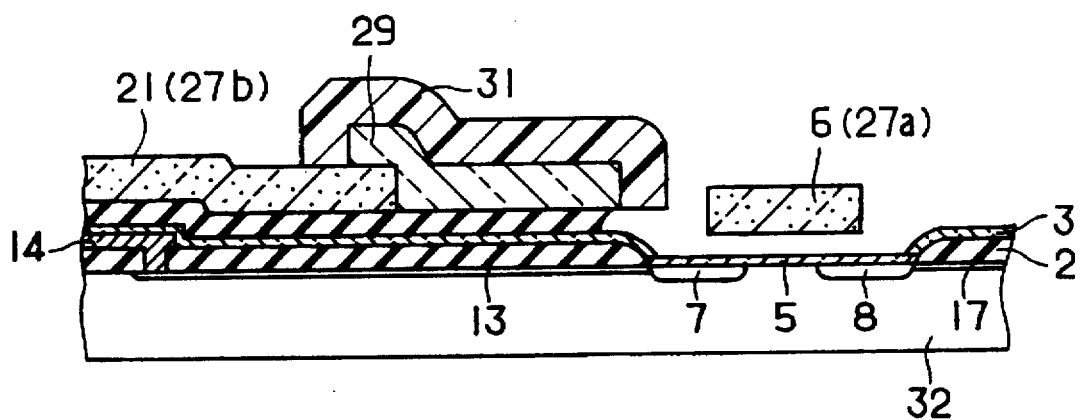

Next, as illustrated in FIG. 8, sacrifice layer etching of the silicon oxide film 26 is performed with a hydrofluoric acid based etching solution by use of a photoresist 31 to thereby etch only the silicon oxide film 26 alone around the polysilicon thin film 27a in the movable gate electrode forming region. By performance of this etching, it is possible to ensure the procurement of a spatial zone around the movable gate electrode 6 and also to eliminate a natural oxide film on the surface of the bonding frame 21 as much as possible. Lastly, the photoresist 31 is removed, whereby the process steps for the formation of the bonding frame 21 are completed. In this case, these process steps can be performed with no spacial steps for the formation of the bonding frame 21 being added. That is to say, since the bonding frame 21 has been formed simultaneously with the formation of the bridged-beam-structural movable gate electrode 6 consisting of a silicon thin film, it is possible to manufacture the bonding frame 21 easily.

The bonding frame 21 can be formed by performance of the above-mentioned process steps. Preferably, the upper surface of this bonding frame 21 is located at a level higher than that corresponding to the upper surface of the movable gate electrode 6.

Next, process steps for the formation of a bonding layer (Au film) 24 formed on the cap 22 will be explained.

The silicon wafer used in this embodiment as the cap 22 makes it possible to ensure the moisture resistance easily and is stably available at a cost which is relatively low as a wafer. In addition, in a case where a silicon wafer is used as the material of which the cap is formed, since the mating substrate to be bonded is silicon, it is possible to suppress the stress resulting from thermal expansion to a small value, with the result that the use thereof becomes advantageous in terms of the reliability.

Figure 9:
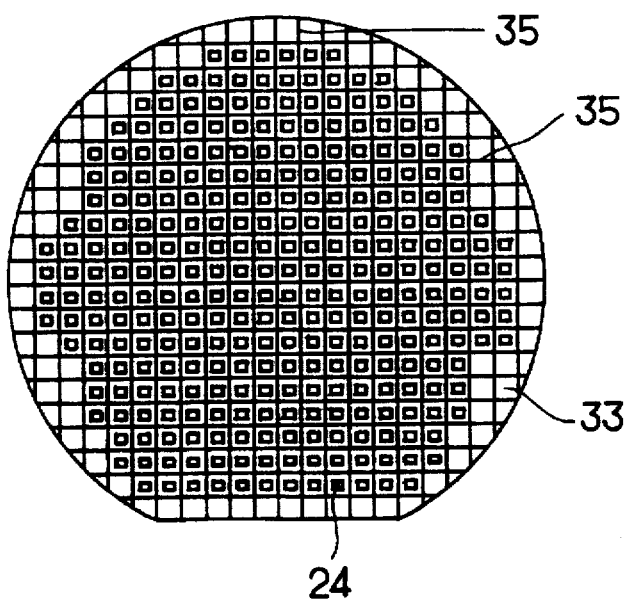
FIG. 9 is a plan view illustrating a cap forming side wafer.
Figure 10:
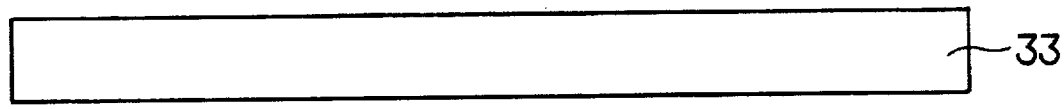
FIGS. 10 and 11 are sectional views illustrating a cap forming side wafer in the order of the manufacturing process steps.
Figure 11:
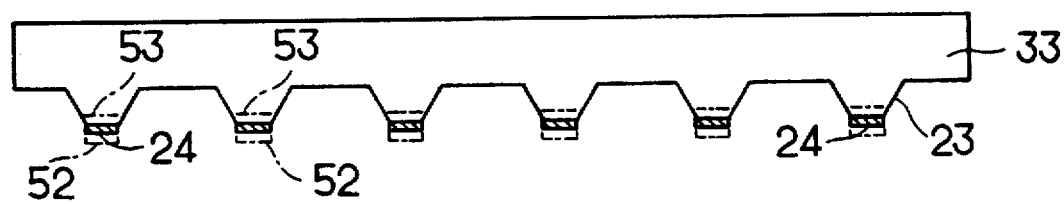

As illustrated in FIGS. 9 and 10, a silicon wafer having the same size as that of the silicon wafer (sensor wafer) having a sensor, etc. formed thereon is prepared as a cap forming silicon wafer 33 for the formation of the bonding layer 24. As illustrated in FIG. 11, when using a silicon (100) plane wafer 33 as the cap material, with a silicon oxide film used as the patterning mask the leg portion 23 is formed using anisotropic etching which uses an alkaline etching solution. This technique is one which is often used in the manufacture of a diaphragm type pressure sensor, etc. Also, this leg portion 23 is formed at a position corresponding to the bonding frame pattern.

Next, the bonding layer 24 is formed on the bottom surface (forward end surface) of the leg portion 23. Specifically, after having formed an underlying metal layer (the thickness thereof is approximately 0.1 µm in the case of Ti, Ni, Cr, etc. and when the substrate is made of glass, this underlying metal is indispensable) with respect to the cap forming silicon wafer 33 in order to provide good adhesion thereof to the Au film, the Au film having a thickness of several microns is formed by use of a plating technique (the thickness is suitably to an extent of 2 to 5 µm). Thereafter, patterning thereof is performed by use of ordinary photolithography. The line width of the pattern is suitably 0.1 to 0.3 mm or so. The line width of the bonding layer 24 is made to be thinner than the line width of the bonding frame 21, that is, designing is performed so that a surface of contact therebetween can be ensured reliably.

At this time, when covering an entire surface of the inner wall of the cap with the use of a conductive layer in such a manner as to clothe the underlying metal and Au plating film, the cap can be made to have an EMI (Electromagnetic Interference) shielding effect. Namely, as indicated in one-dot chain lines in FIGS. 2 and 3, an Au film 51 is disposed on the inner surface of the cap 22 and, by the resulting cap being made to have ground potential in the substrate, the cap can be made to function as an electromagnetic shielding layer. As mentioned above, by forming the bonding layer 24 using a conductive material (Au) and forming the Au film 51 in such a manner as to cover the entire inner wall surface of the cap including this Au film of conductive material and connecting this Au film 51 to reference potential on the element forming silicon wafer side via the bonding frame 21, it is possible to make the cap have the shielding effect with respect to the electromagnetic interference (EMI). More specifically, since it is possible to make the cap have the shielding effect by covering the entire cap with the use of a conductive layer, it is possible to decrease the influence of noises upon the internal functional element or conversely to stop the generation of noises from the internal functional element to the outside thereof. This effect does not depend on the kind of the functional elements and the same effect as mentioned above can be expected with regard to electronic circuits, etc. as well. Thus, this technique has wide availability.

Also, when desiring to decrease the amount of Au used, it is sufficient to perform deposition as a mask of an underlying metal on only the bottom surface of the leg portion 23 and inner surface of the cap inward therefrom and then to apply selective plating of Au thereto and thereby form the bonding layer.

Also, as stated previously, the width of the leg portion 23 of the cap is designed beforehand so as to become thinner than the line width of the bonding frame 21. However, at this time, when the leg portion 23 of the cap has been formed as in the case of this embodiment, since when pressing the cap onto the bonding frame 21 it becomes easy to ensure a surface of contact at the bottom surface portion of the leg portion 23, there is the advantage that more excellent seal characteristic is easy to obtain. Also, when desiring to form a good bonding layer with no voids contained therein from an alloy layer produced through a reaction between Au and polysilicon, it is preferable to suppress the diffusion of Au into the Si side as much as possible. For this purpose, first, an oxide film (indicated by a reference symbol 53 in FIG. 11) which serves as a diffusion prevention layer is formed on the surface of the silicon becoming the cap and then the underlying layer is formed. By thereafter bonding the Au film to the resulting leg portion, the oxide film becomes a barrier layer for preventing the diffusion of Au, with the result that unnecessary movement of Au can be prevented and as a result the production of voids can be prevented.

Next, the bonding of the cap forming silicon wafer 33 to the silicon wafer 32 and the dicing cut will be explained.

Figure 12:
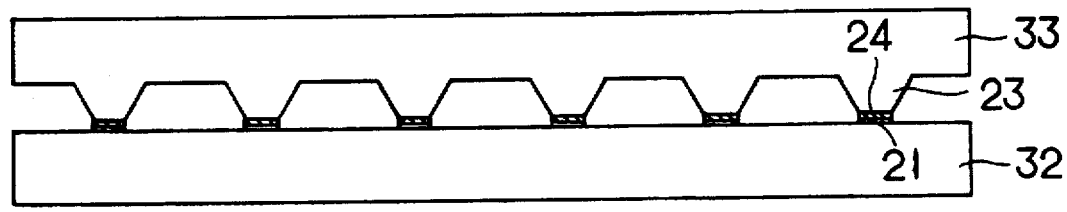
FIG. 12 is a view illustrating a bonding step for making bondage between the both wafers.

As illustrated in FIG. 12, the cap forming silicon wafer 33 having the leg portion 23 formed thereon is positionally aligned with the silicon wafer (semiconductor wafer) 32 having the sensor, etc. formed thereon, whereupon the bonding layer 24 (Au film) formed on the leg portion 23 is superposed on the bonding frame 21 consisting of the silicon film. Thereafter, the both layers are thermally press bonded to each other. More specifically, bonding is preformed at a treating temperature of around 400° C. (the eutectic temperature of Au and Si: 363° C.) under a loading weight of approximately 0.2 to 1 Kg/mm² for a processing time period of several tens of minutes.

Figure 15:
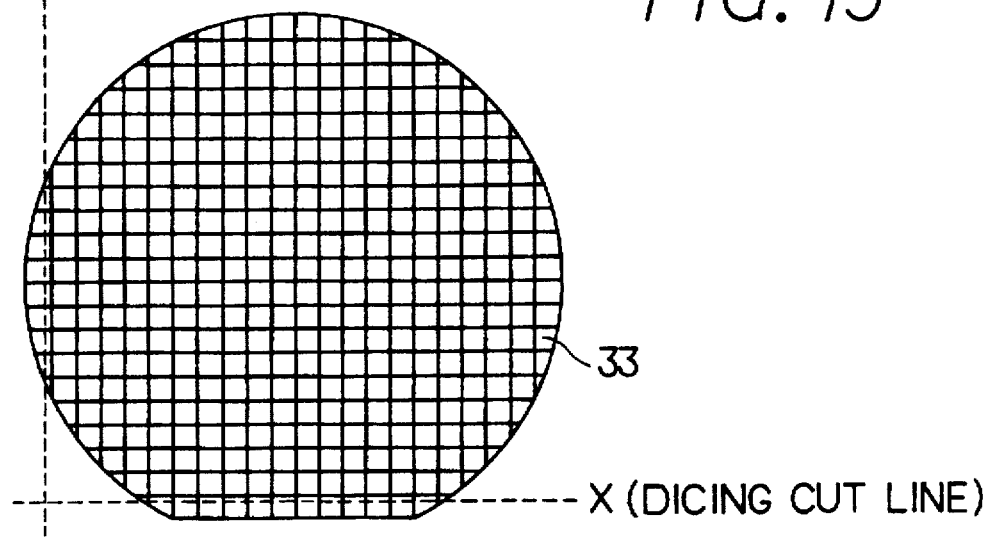
FIG. 15 is a plan view of a wafer, illustrating dicing cut lines.

As a method for positional alignment, standard lines are formed beforehand with respect to the cap forming silicon wafer 33 by performing dicing cut in X and Y directions in corresponding relationship to the positions of the dicing lines of the silicon wafer 32 as illustrated in FIG. 15. After positionally aligning these standard lines with the dicing lines of the silicon wafer 32, the cap forming silicon wafer 33 is mounted on the silicon wafer 32 and press bonded thereto. Also, if a mounter having a pattern recognizing mechanism is used, it is possible to perform easily positional alignment by providing marks with respect to the cap forming silicon wafer 33 and the silicon wafer 32 respectively.

The mounting precision is sufficient if it is ten and odd microns or less.

Also, if when bonding the two wafers the bonding is performed in an atmosphere of vacuum or inert gas or under a prescribed level of pressure, the interior of the cap can be made to have a vacuum or inert-gas atmosphere or a prescribed pressure. That is, since the cap 22 and the bonding frame 21 formed on the silicon surface having the functional element formed thereon are bonded together in a state of high airtightness by use of the metal alloy, it is possible to make the internal pressure of the cap fixed (e.g., vacuum seal can be realized). Specifically, since the bondage can be made up into a closed structure, it is possible to maintain the interior of the cap in vacuum and thereby maintain the sensitivity of the sensor at a high level. Or it is possible to fill the interior of the cap with an inert gas and thereby prevent the deterioration or to make the internal pressure of the cap fixed and thereby obtain a reference pressure when the interior of the cap has been embodied as a pressure sensor.

The cap material is bonded as mentioned above. At this time, it is possible to make the spatial portion 25 sufficiently large in size by providing the leg portion 23 with respect to the cap 22 and therefore to expect also production of the airtight-sealness improving effect by enlarging the capacity of the spatial portion.

Note the following. In this bonding process, when having formed the bonding frame 21 by use of a silicon thin film, there sometimes occurs the inconvenience that a natural oxide film (the thickness: several nanometers) is produced on the surface of the silicon prior to the performance of the bonding process, thereby obstructing the adherence thereof to the Au film, whereupon the eutectic reaction does not proceed. Concerning this, as stated previously, it is sufficient to perform the bonding process immediately after the performance of the sacrifice layer etching treatment by use of a hydrofluoric acid solution, or in the case where the bonding process cannot be performed immediately to perform light etching of the oxide film newly by use of a $CF_4$ based gas and perform the bonding process soon thereafter.

In addition to the above-mentioned technique, as a method for positively breaking such a natural oxide film to thereby obtain a good bondage, a thin film (the thickness: 0.1 μm or so) made of a material fusible at a temperature equal to or lower than the Au/Si eutectic temperature (363° C.) may be also formed on the surface of the metal film (Au film) 24 becoming the bonding layer on the cap 22 side. Specifically, a Si film, Ge film, Sn film or the like is used (the Au/Ge eutectic temperature: 356° C., and the Au/Sn eutectic temperature: 280° C.). This thin film is indicated by a reference symbol 52 in FIG. 11. By the formation thereof, when bonding is performed, the temperature is elevated once up to a temperature higher than the eutectic temperature to thereby cause fusion of the surface layer of the Au film. As a result, the oxide film on the surface of the silicon film constituting the bonding frame 21 is broken, whereby a solid/liquid boundary face is produced therebetween. This enables occurrence of a good eutectic reaction. At the bonding time, the bonding process is performed in an atmosphere of inert gas (He, Ar, $N_2$ or the like) or reducing gas ($H_2$) or in vacuum.

Figure 13:
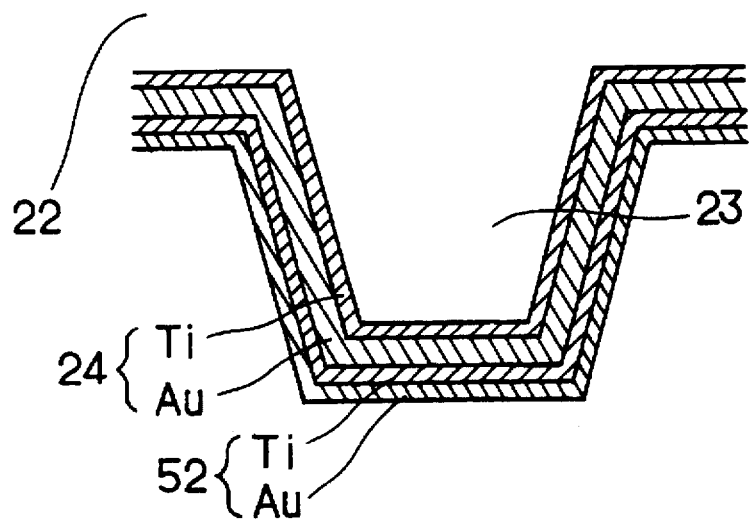
FIG. 13 is a sectional view illustrating main components of another bonding layer.

Also, as a method for similarly positively breaking the natural oxide film on the silicon surface to thereby obtain a good bondage, metal (e.g., Ti, Al, Ta, Zr, Nb, etc.) for reducing a silicon oxide film may be deposited several to several tens of nanometers on the surface of the metal film (Au film) 24 becoming the bonding layer on the cap 22 side and, on this deposited metal, a metal film (52 in FIG. 13) such as Au which is non-oxidizable may be coated 10 to 20 nm or so in order to prevent oxidation of the reducing metal. When performing the bonding by heating and pressurization, the reducing metal (e.g., Ti) on the surface side diffuses into the Au film of the outermost surface and reaches the surface of the silicon on the sensor wafer side and deprives the natural oxide film of the silicon of its oxygen to thereby destroy the oxide film. As a result, the reaction between Au and silicon occurs uniformly over an entire region of the bonding interface, with the result that it is possible to form the bonding interface with almost no voids produced therein. In this case as well, the bonding process is performed in an atmosphere of inert gas or reducing gas or in vacuum.

Figure 14:
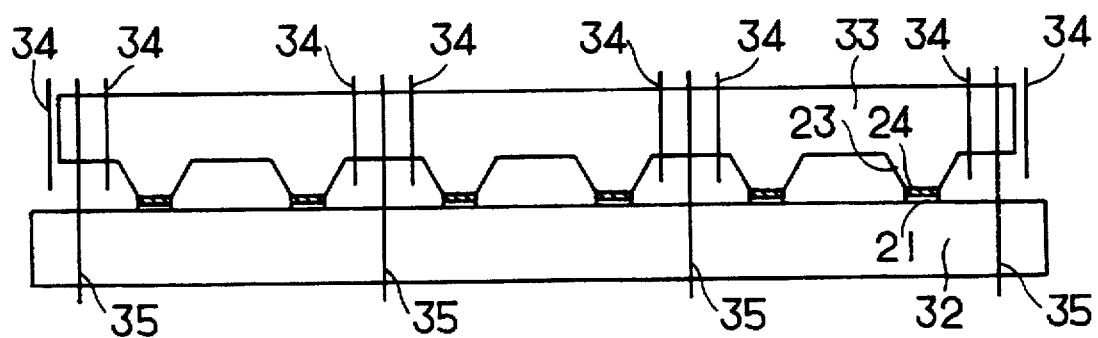
FIG. 14 is a view illustrating a dicing cut step.

After the cap forming silicon wafer 33 prior to chipping thereof has been bonded collectively, as illustrated in FIG. 14 cutting thereof is performed at positions each indicated by a reference symbol 34, leaving only necessary portions thereof alone as they are with the rest being removed.

Figure 16:
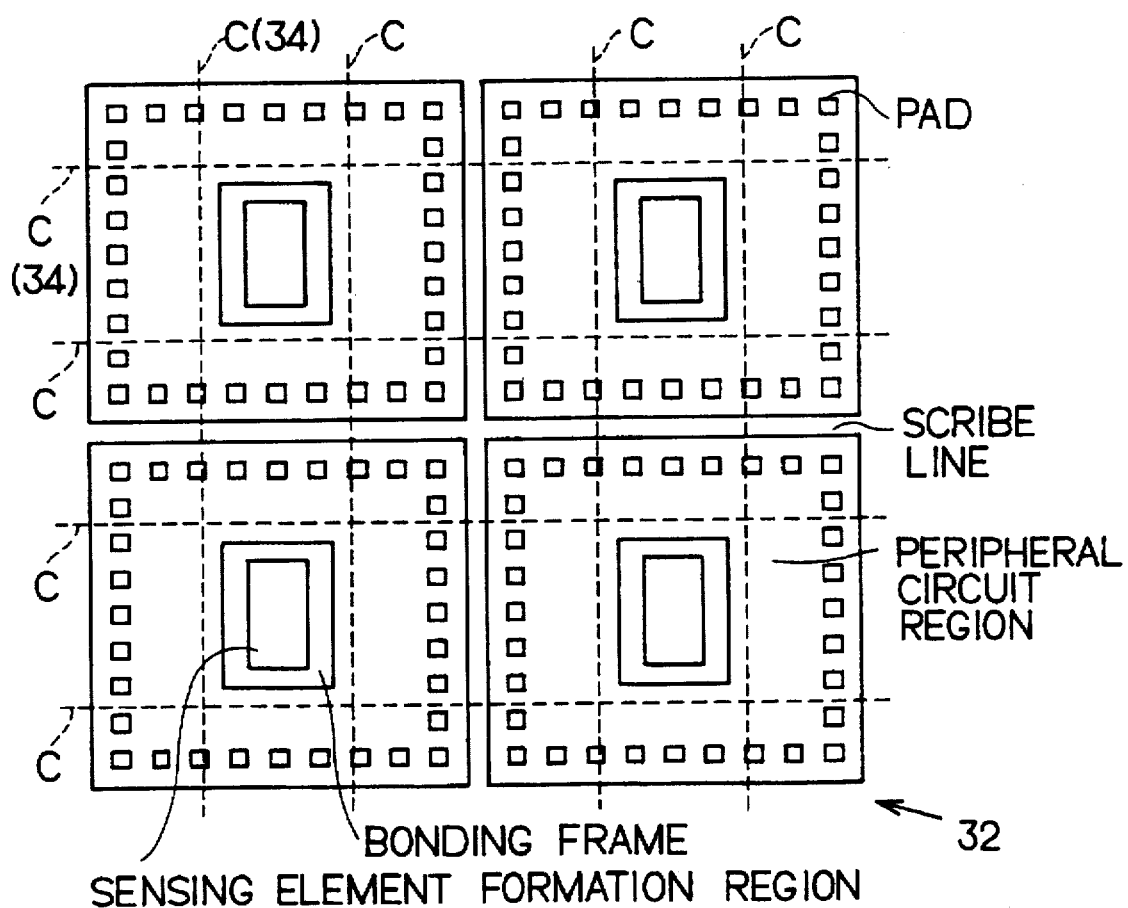
FIGS. 16 and 17 are plan views presented for explaining the dicing positions.
Figure 17:
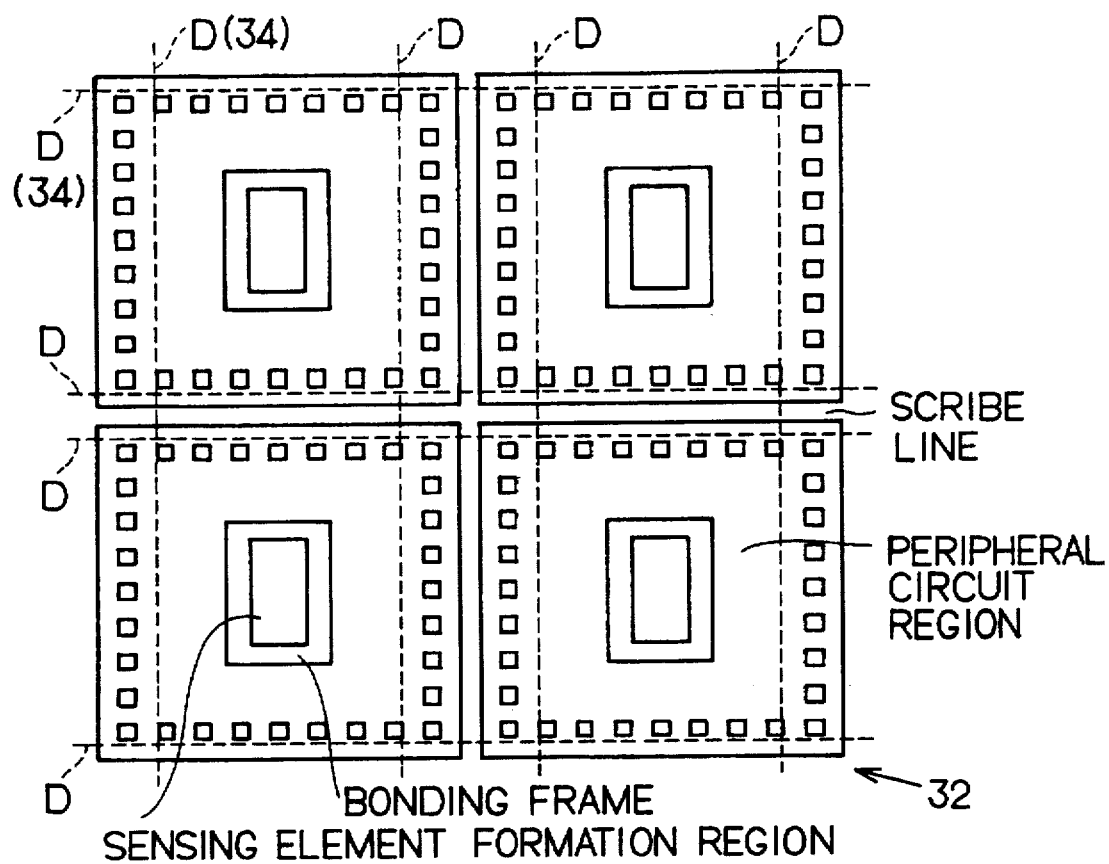

The cutting positions where the cap forming silicon wafer 33 is cut are illustrated in FIG. 16. When cutting thereof is performed to a necessary minimum size (set taking the mounting precision and the dicing cut precision into consideration) for protecting the movable gate electrode (movable portion) of the sensing element, the cutting process is done at the cutting positions illustrated in FIG. 16. Note here that when it is necessary to protect the surface of the element forming silicon wafer 32 from scattering of unnecessary chips following the cutting operations of the cap portion as widely as possible, the cutting is performed as closely to the scribe lines as possible so as to cover the regions other than necessary electrode pads thereof as at the cutting positions 1 D illustrated in FIG. 17.

Figure 18:
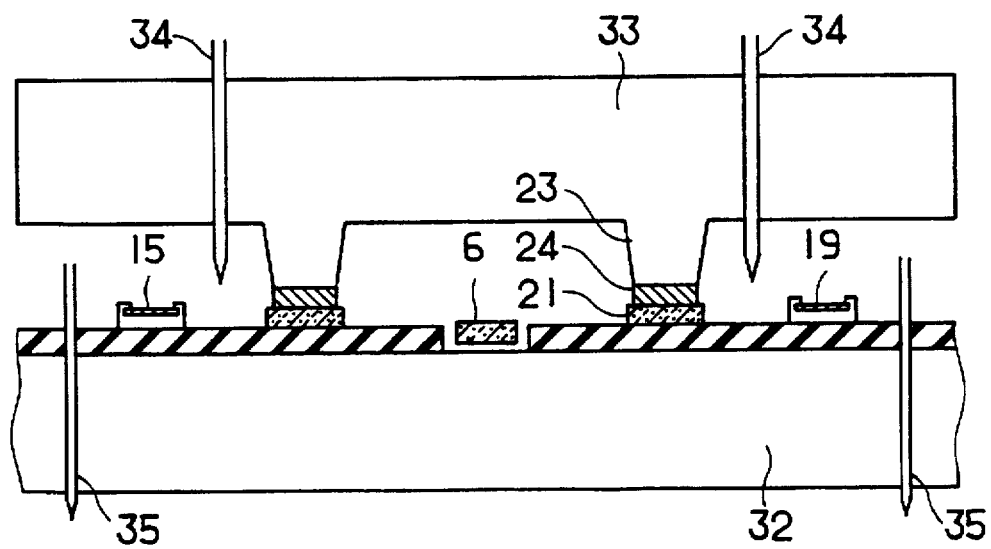

FIG. 18 is a typical sectional view at the time of dicing cut during the cutting process of the cap forming silicon wafer 33. While in FIG. 18 the cutting positions of the cap forming silicon wafer 33 are those indicated by reference symbols 34, at this time care should be taken so as for the blade of a dicing saw not to impair the surface of the silicon wafer 32. For this purpose, the cap portion 23 of the cap forming silicon wafer 33 plays an important role. That is, when taking the flatness of a wafer-fixing stage of the dicing saw, the variations in thickness of the silicon wafer and the process margin into consideration, in case of a silicon wafer whose diameter is 6 inches the length of the leg portion 23 of the cap forming silicon wafer 33 is made to be not less than 90 μm or so. That is, the distance between the bottom surface of the cap forming silicon wafer 33 and the upper surface of the silicon wafer 32 can be lengthened by means of the leg portion 23, thus to provide an advantage in performing dicing with respect to the cap forming silicon wafer 33.

Figure 20:
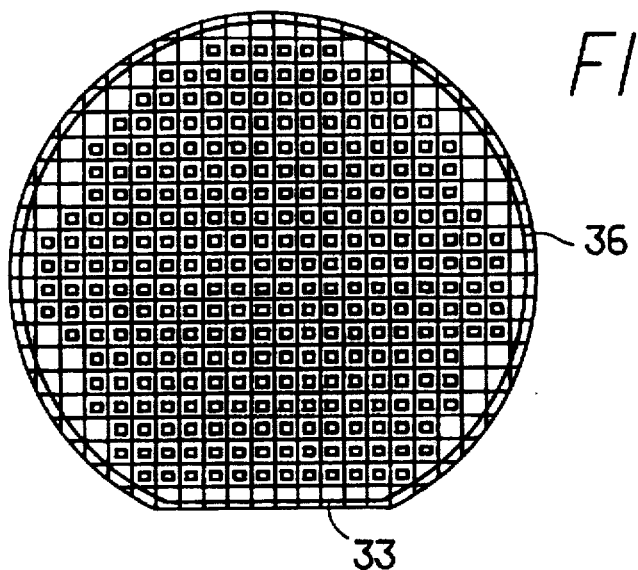
FIG. 20 is a plan view of a wafer, illustrating another example of the first embodiment.

Note the following. When during the dicing cut process of the cap forming silicon wafer 33 there occurs the inconvenience that the wafer vibrates at its edge portion whereby the bonded portion is peeled off or the blade of the dicing saw is broken, it is advantageous to provide such a peripheral fixed layer 36 as illustrated in FIG. 20 at the peripheral portion of the cap forming silicon wafer 33. It is sufficient that this fixed layer be formed at only the positions on the cutting lines. Also, at such a time when unnecessary chips which have been separated when having cut the cap forming silicon wafer 33 scatter and become liable to damage chippings of the cap 22 or the underlying layer, it is effective to perform half cutting every second line to thereby not completely separate unnecessary chips and thereby avoid occurrence of the inconveniences resulting from scattering thereof, or also effective, after having cut along one direction (e.g., X direction), to bond an adhesive tape and then cut the resulting wafer along the other direction (Y direction) to thereby prevent scattering of unnecessary chips.

Figure 19:
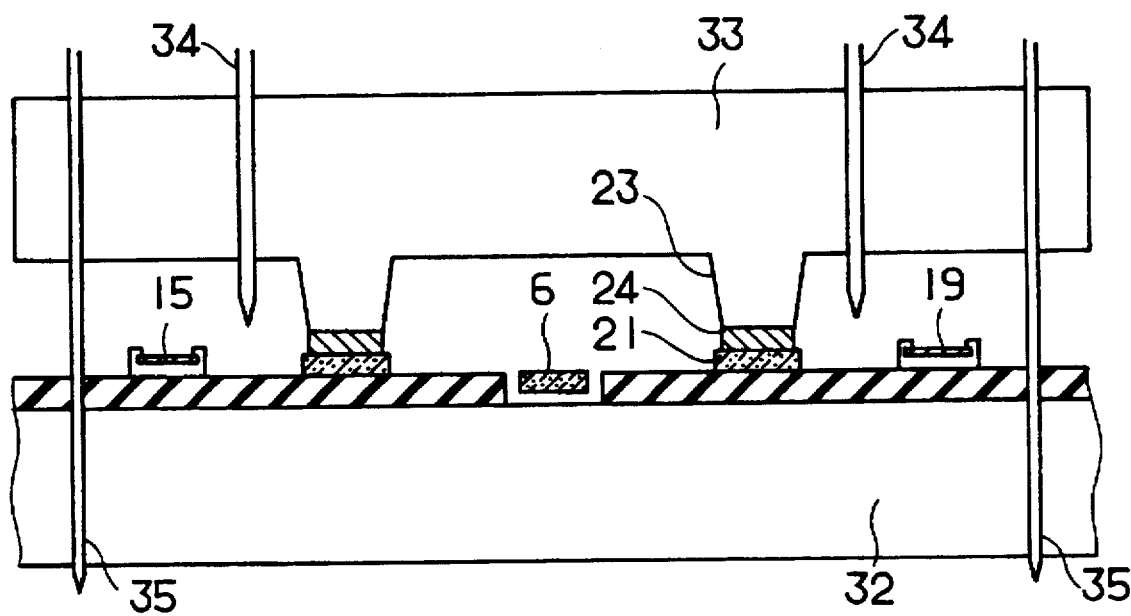
FIGS. 18 and 19 are enlarged views illustrating main components of dicing cut steps.

Upon completion of the cutting process and unnecessary-portion elimination process of the cap forming silicon wafer 33, as illustrated in FIG. 18 dicing cut with respect to the scribe lines of the silicon wafer 32 is next performed at dicing cut positions 35 thereof. By this dicing cut, the silicon wafer 32 is divided into individual chips as illustrated in FIGS. 1 through 3. As mentioned above, after having cut the cap forming wafer 33 from above at the positions indicated by the reference symbols 34, it is possible to cut the silicon wafer 32 similarly from above at the positions indicated by the reference symbol 35. Also, as illustrated in FIG. 19, after having simultaneously done dicing cut with respect to the wafers 33 and 32 at the positions indicated by the reference symbol 35, the wafer 33 may be cut at the positions 34 to thereby form the cap 22.

While during this dicing operation a water flow and water pressure also are applied, the functional element (sensing element having a bridged beam electrode structure, etc.) which needs to be protected from an external force is protected by means of the cap 22.

Figure 21:
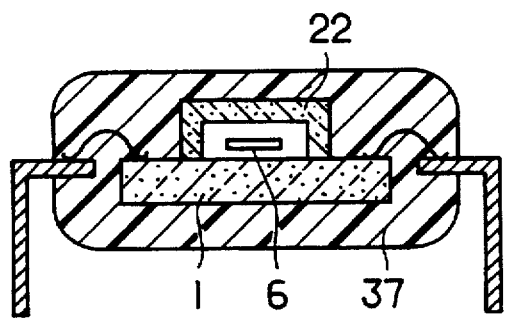
FIG. 21 is a sectional view illustrating a molded sensor chip.

Lastly, as illustrated in FIG. 21, resin molding is performed with the use of a molding material. At this time, it is possible to protect by means of the cap 22 the movable gate electrode (the movable portion of the sensor) and the like which are the important structure of the chip from the external force occurring when the chip is resin sealed.

As mentioned above, in this embodiment, the bonding frame 21 consisting of a silicon thin film was patterned around the element forming region on the surface of the silicon wafer (semiconductor wafer) 32 for the formation of the movable gate MOS transistor (the sensing element: the functional element), the bonding layer 24 consisting of a gold film was patterned at the position of the cap forming silicon wafer 33 that corresponds to the bonding frame pattern, heating was performed up to a temperature equal to or higher than the Au/Si eutectic temperature in a state of contact between the bonding frame 21 of the silicon wafer 32 and the bonding layer 24 of the cap forming silicon wafer 33, and then the both wafers 32 and 33 were diced in chip units. As mentioned above, since the bonding frame 21 consisting of a silicon thin film was patterned and the bonding layer 24 consisting of a gold film was patterned on the cap forming silicon wafer 33 and the both wafers 32 and 33 were bonded together, a semiconductor device having the protective cap 22 for covering the element can be easily manufactured with the use of an ordinary semiconductor-manufacturing technique. That is, since the silicon wafer 33 becoming the cap has been bonded collectively onto the entire surface of the silicon wafer 32 and then cut by dicing cut operations, it is possible to form the protective caps 22 efficiently with respect to the individual functional element portions.

Also, since the polysilicon thin film is used as the material of the bonding frame, it is possible to use the bonding-frame forming process steps which suit the silicon wafer process, with the result that it is possible to form the bonding layer (Au plating film) without making selection of the cap material. Therefore, this technique has wide availability. More specifically, although when bonding the cap 22 to the chips individually the through-put decreases, this shortcoming becomes improved. That is to say, by performing collective bonding and collective cutting of the cap forming silicon wafer 33, the formation of the protective caps at a low cost becomes possible.

Further, since the use of a cap material having no air-permeability can provide an airtight seal, it is possible to provide a highly reliable sealed structure without causing deterioration of the performance of the sensor to be protected. In this case, since the use of even a resin-sealed package as illustrated in FIG. 21 makes it possible to ensure sufficiently high reliability, it is possible to package, for example, a sensor having a movable portion at a low cost.

As an applied example of this embodiment, an amorphous silicon thin film may be used as the material of the bonding frame 21 in place of a polysilicon thin film. In this case as well, the bonding-frame forming process steps which suit the silicon wafer process can be used with the result that the bonding layer (Au plating film) can be formed without making selection of the cap material. Therefore, this technique also has wide availability.

(Second Embodiment)

Next, a second embodiment of the present invention will be explained mainly in connection with the points of difference between this embodiment and the first embodiment.

In this embodiment, the sensing element is manufactured using the bonding-frame forming process steps in FIGS. 22 through 26 in place of the bonding-frame forming process steps illustrated in FIGS. 4 through 8 according to the first embodiment.

Figure 22:
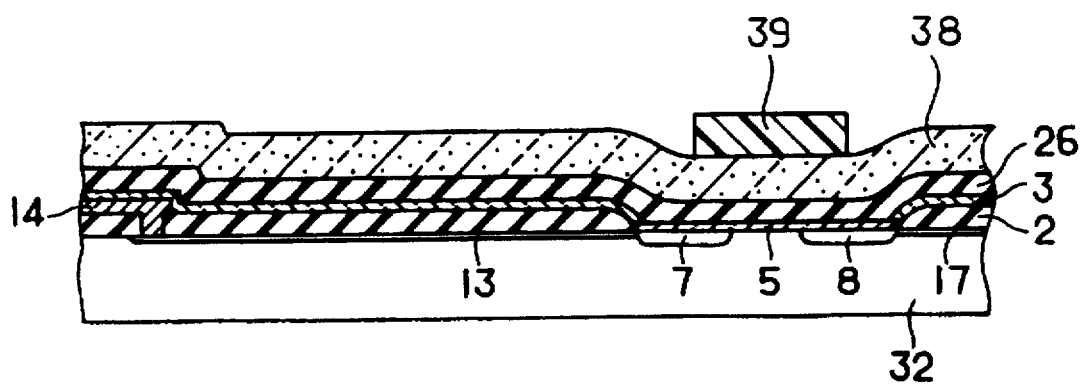
FIGS. 22 through 26 are sectional views illustrating main components of a sensing element forming side wafer according to a second embodiment of the present invention in the order of the manufacturing process steps.
Figure 23:
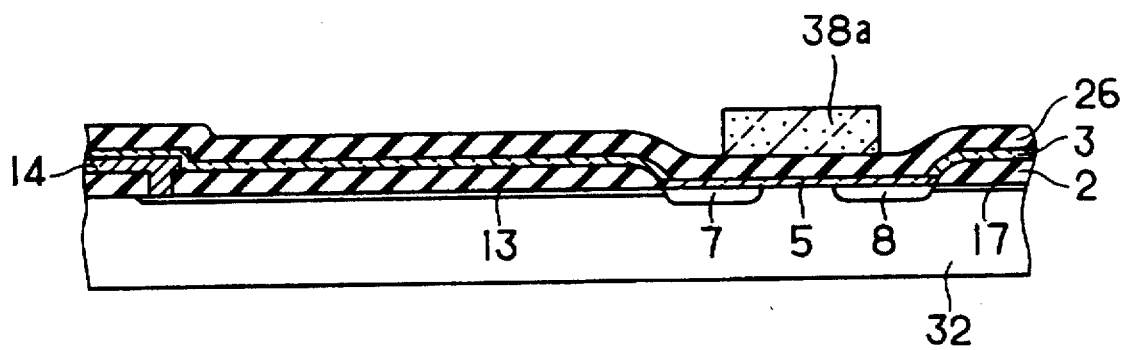
Figure 24:
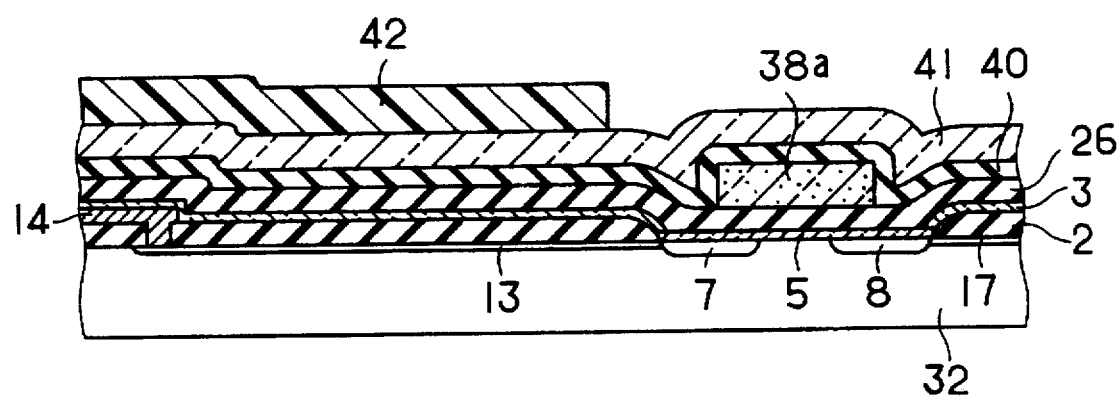
Figure 25:
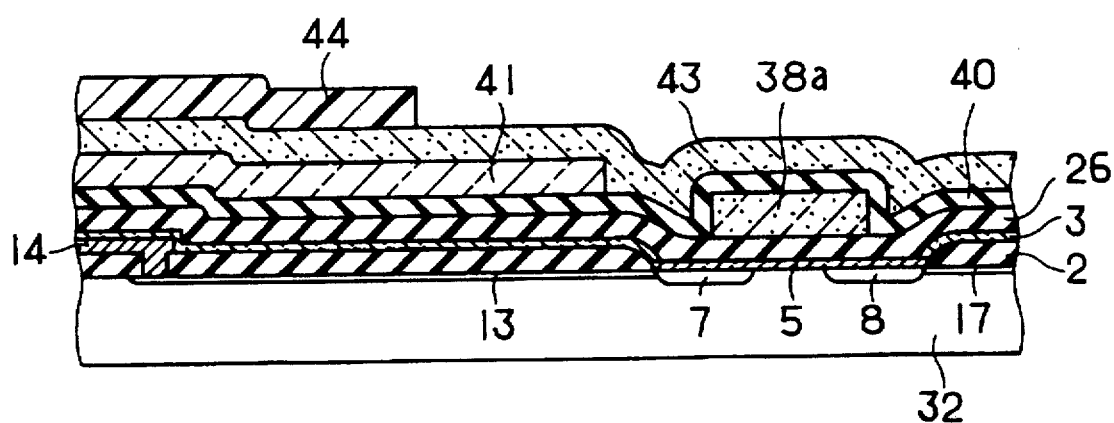

As illustrated in FIG. 22, on the silicon oxide film 26 there is deposited a movable gate electrode forming polysilicon thin film 38 on which a photoresist 39 is disposed over a prescribed region. Then, as illustrated in FIG. 23, the polysilicon thin film 38 is patterned using the photoresist 39. Thereafter, as illustrated in FIG. 24, an insulating film 40 (oxide film) is disposed, after which a final protective film 41 (a silicon nitride film based on the use of a plasma CVD method) is disposed. Then, through the performance of the photolithography using a resist 42, as illustrated in FIG. 25, the protective film 41 over the movable gate electrode forming region is removed. Next, a silicon thin film 43 is disposed that becomes the bonding frame. As a method for the formation of the silicon thin film 43 there is used the plasma CVD method enabling the film formation at a temperature causing no damage to the aluminum wiring, etc. As a more specific material of the bonding frame use is made of an amorphous Si film or an amorphous SiN film rich in Si. According to the experiments performed by the present inventors, it is confirmed that when the elemental composition ratio of Si to N is 1.5 or more, this film can be handled almost as in the case of a silicon film.

Figure 26:
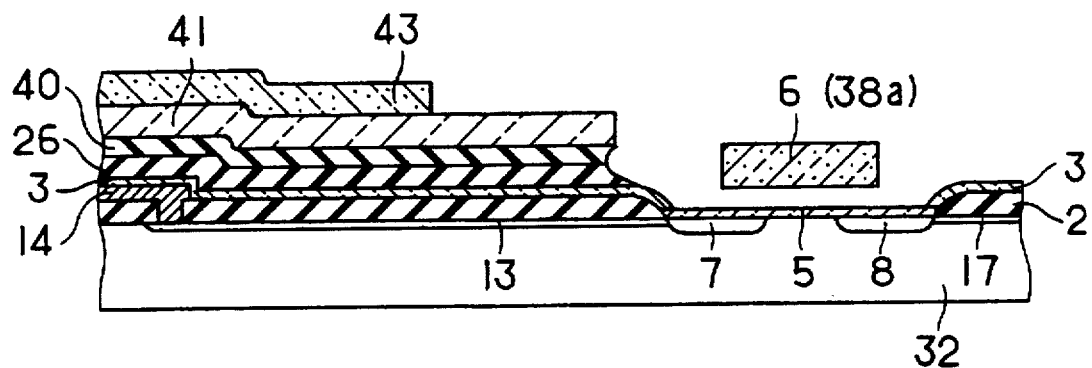

This amorphous silicon thin film 43 is patterned by the photolithography process which uses a resist 44 and the silicon thin film 43 serving as the bonding frame is formed as illustrated in FIG. 26. Then, with the necessary portions being protected using a photoresist, sacrifice layer etching is performed for leaving the polysilicon thin film 38a becoming the movable gate electrode 6 as it is, to thereby form the spatial portion.

In this embodiment, there is the advantage that since the bonding frame 21 is formed on the final protective film 41, the degree of freedom for layout with respect to the IC chip designing increases.

(Third Embodiment)

Next, a third embodiment of the present invention will be explained mainly in connection with the points of difference between this embodiment and the first embodiment.

In this embodiment, the sensing element is manufactured using process steps of FIGS. 27 through 32 in place of the process steps illustrated in FIGS. 10 through 12 and FIG. 14 according to the first embodiment.

Figure 27:
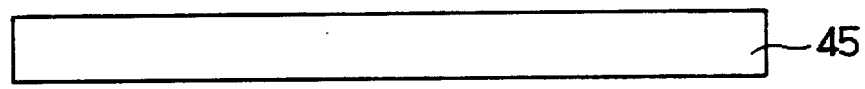
FIGS. 27 through 32 are views presented for explaining a method for manufacturing a sensor chip according to a third embodiment of the present invention.
Figure 28:
Figure 29:
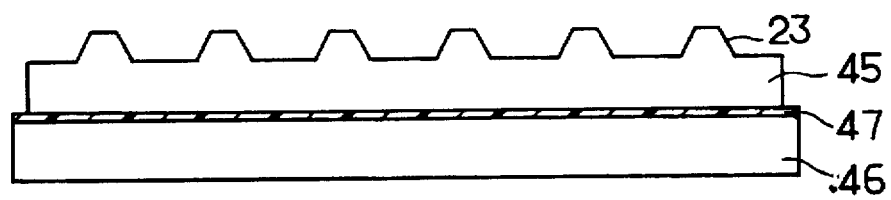
Figure 30:
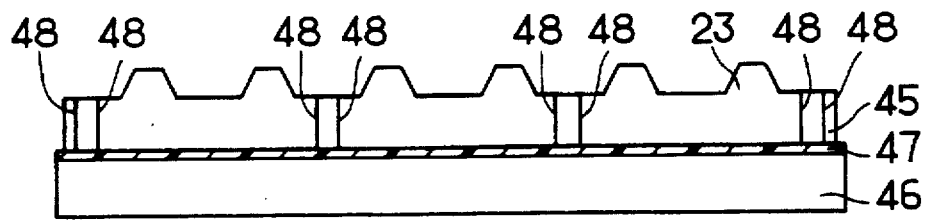

As illustrated in FIG. 27, a cap forming silicon wafer 45 is prepared and, as illustrated in FIG. 28, a leg portion 23 is formed. On the other hand, as illustrated in FIG. 29, an adhesive layer 47 (e.g., polyimide resin, high-molecular thermoplastic adhesive, etc.) is spin coated on a support wafer 46 (e.g., silicon wafer) serving as a wafer supporting member and then the cap forming silicon wafer 45 is bonded onto the support wafer 46 via the adhesive layer 47. Then, as illustrated in FIG. 30, dicing cut with respect to the cap forming silicon wafer 45 is done at positions each indicated by a reference symbol 48 to thereby perform full cut thereof to a desired cap size. Namely, cuts are made for the division and formation thereof into caps in chip units. If at this time these cuts made by the blades of the dicing saw are made to remain within the adhesive layer 47, reuse of the support wafer 46 becomes possible. As mentioned above, dicing of the cap forming silicon wafer 45 to a desired cap size is performed beforehand at a time before it is bonded to the sensor forming silicon wafer.

Figure 31:
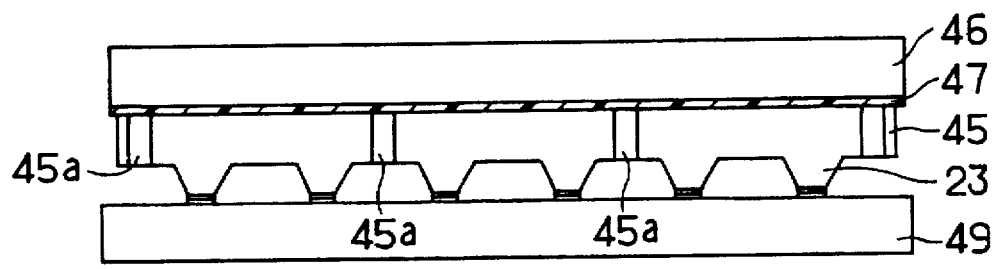
Figure 32:
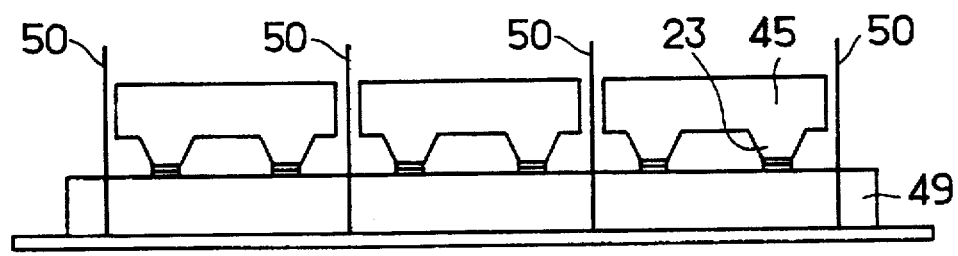

Further, as illustrated in FIG. 31, the cap forming silicon wafer 45 is positionally aligned with and mounted on the functional element forming silicon wafer 49 in the same manner as in the case of the first embodiment and then is thermally bonded thereto. Next, as illustrated in FIG. 32, treatment for weakening the adhering force of the adhesive layer 47 (e.g., weakening thereof by thermal decomposition) is performed to thereby peel off the support wafer 46 jointly with unnecessary portions 45a (indicated in FIG. 31) of the cap forming silicon wafer 45, leaving only the caps alone as they are on the functional element forming silicon wafer 49. Namely, the support wafer 46 is separated from the cap forming silicon wafer 45 to thereby remove the unnecessary portions 45a of the cap forming silicon wafer 45. As a result, the unnecessary portions 45a of the cap forming silicon wafer 45 can be removed reliably without causing scatter thereof.

Lastly, the functional element forming silicon wafer 49 is diced at positions each indicated by a reference symbol 50.

As mentioned above, in this embodiment, the cap forming silicon wafer 45 having the bonding layer pattern is adhered to the support wafer 46, whereupon cuts for division and formation into caps in chip units are made with respect to the cap forming silicon wafer 45. Then, the cap forming silicon wafer 45 and the functional element forming silicon wafer 49 are bonded together, after which the support wafer 46 is separated from the cap forming silicon wafer 45 to thereby remove the unnecessary portions 45a thereof. Accordingly, there is no possibility that when cutting the cap forming silicon wafer 45, unnecessary chips may scatter to cause damage to the surface of the functional element forming silicon wafer 49 and accordingly the cutting positions may be those C (see FIG. 16) in the case of the first embodiment.

Figure 33:
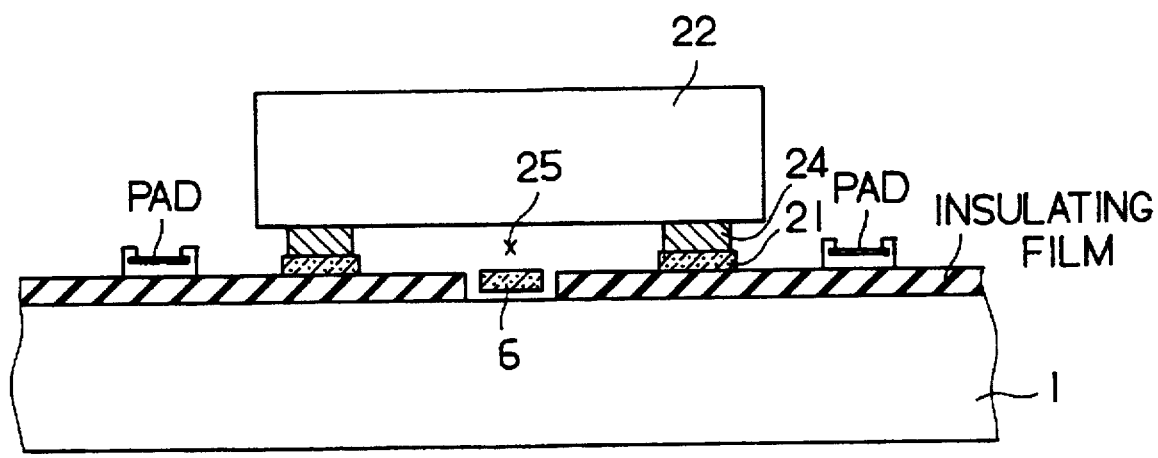
FIG. 33 is a sectional view of a chip, illustrating another example of the third embodiment.

Also, since no cutting operation is done after the cap forming silicon wafer 45 has been bonded, the process according to this embodiment is effective also when no leg is formed on the cap as illustrated in FIG. 33.

As an applied example of this embodiment, it is possible to use instead of the support wafer 46 a dicing sheet which consists of a polyimide based film having adhesiveness imparted thereto.

Figure 34:
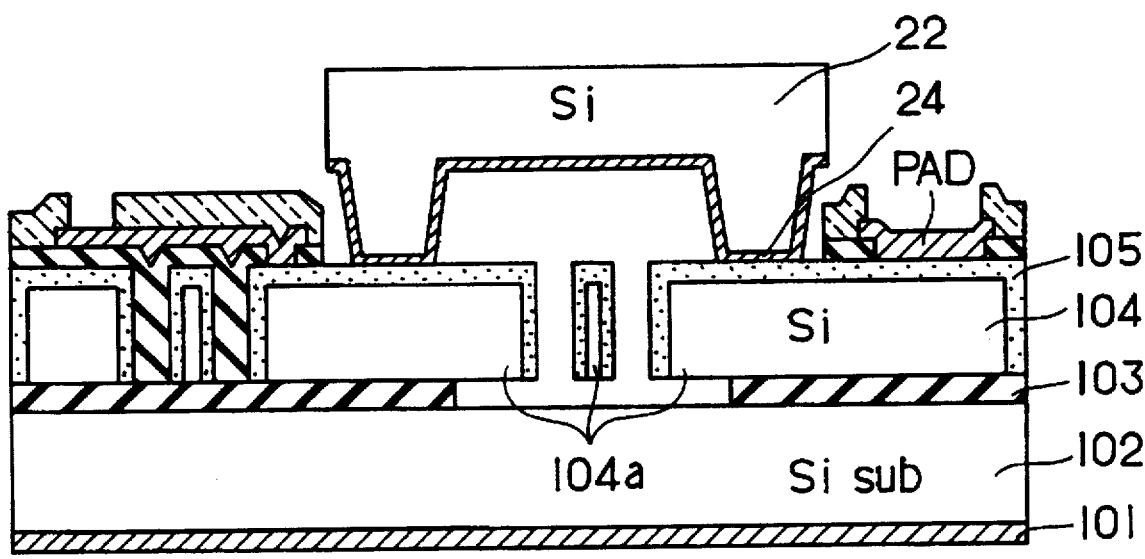
FIG. 34 is a sectional view of a chip, illustrating a sensor structure having an SOI structure.

While in the first and second embodiments the silicon bonding frame on the sensor wafer side was formed using the polysilicon or amorphous silicon film, there are cases where a sensor portion is formed in a composite wafer structure made up with the use of a wafer bonding technique as illustrated in FIG. 34. That is, a support substrate 102 and a substrate 104 on a side wherein a sensor structure is to be made up are bonded directly to each other through the intermediary of an oxide film 103. Thereafter, micromachining is performed with respect to the substrate 104 (SOI layer) to thereby form a micro suspended structure of beams 104a. Thereafter, necessary wiring structures are formed and a cap wafer is bonded to the resulting composite wafer structure, whereupon dicing is done. Note here that a reference symbol 101 designates a reverse surface electrode formed on the reverse surface of the substrate. In this case, the sensing operation of the sensor is performed by detecting the fluctuations in the electrostatic capacitances between the beams 104a via a diffusion layer 105 formed on the substrate 104. In this case, while the silicon bonding frame on the sensor wafer side is made up of a silicon substrate (single crystal), it is possible in this case also to bond the cap wafer thereto as in the case of the bonding frame made up of polysilicon or amorphous silicon.

The present invention is not limited to the above-mentioned embodiments but may be also embodied in the following modes.

As the material of the cap forming wafer there can be used glass, ceramic, resin, etc. in addition to silicon. Further, any material can be used only if it can resist the Au-Si eutectic bonding temperature and has no problem with element-contamination seal characteristic. At this time, there is the need to make selection thereof by taking the cost and environment resistance thereof into consideration. When desiring to make the cap transparent, the use of a synthetic quartz glass is suitable.

Also, the present invention can be embodied not only as a semiconductor acceleration sensor but also as a semiconductor device such as a micro diaphragm pressure sensor having a movable portion (vibrational portion) on the silicon chip or as a device having a contract or the like.

As has been described in detail, the present invention brings about the excellent advantage of enabling easy manufacture of a semiconductor device having a protective cap.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device including a semiconductor wafer having a functional element formed on a surface thereof and a cap covering the functional element with a spatial portion being provided with respect to this functional element on the surface of the semiconductor wafer, comprising:

a functional element forming step of forming a plurality of functional elements on the semiconductor wafer for the formation of the functional elements and forming pads for making wire connection between each functional element and the outside, between the functional element and a predetermined position of the semiconductor wafer at which this semiconductor wafer is to be divided;

a bonding frame forming step of forming a bonding frame surrounding each functional element in a region around each functional element on the surface of the semiconductor wafer and on a side nearer to the functional element than to the pad;

a bonding step of bonding a cap forming wafer having a leg portion at a position corresponding to the bonding frame, onto the semiconductor wafer by making bondage between the leg portion and the bonding frame; and a cutting step of cutting the semiconductor wafer at the predetermined position thereof at which this semiconductor wafer is to be divided and also cutting the cap forming wafer at a cutting position on a side nearer to the bonding frame than to the position of the cap forming wafer that opposes the pad.

2. A method as set forth in claim 1, wherein:
the cutting step is to cut simultaneously the predetermined position of the semiconductor wafer at which this semiconductor wafer is to be divided and the position of the cap forming wafer that opposes the predetermined position of the semiconductor wafer, and
thereafter to cut the cutting position of the cap forming wafer.

3. A method as set forth in claim 1, wherein:
the cutting step is to cut the cutting position of the cap forming wafer; and
thereafter to cut the predetermined position of the semiconductor wafer at which this semiconductor wafer is to be divided.

4. A method as set forth in claim 1, in which the bonding frame consists of a material containing silicon (Si); and which further comprises a bonding layer forming step of forming a bonding layer consisting of a material containing a gold (Au) onto the leg portion; and wherein
the bonding step is to heating up to a temperature higher than a gold (Au)/silicon (Si) eutectic temperature in a state wherein the bonding frame of the semiconductor wafer and the cap forming wafer are in contact with each other to thereby bond the bonding frame of the semiconductor wafer and the bonding layer of the cap forming wafer.

5. A method as set forth in claim 4, further comprising a step of disposing as an electromagnetic shielding layer a gold (Au) layer becoming the bonding layer on the inner surface of the cap.

6. A method as set forth in claim 4, wherein the functional element includes a movable gate electrode having a bridged beam structure, the movable gate electrode consisting of a silicon thin film, and a fixed source electrode and fixed drain electrode formed in the semiconductor wafer; and the movable gate electrode and the bonding frame are formed simultaneously.

7. A method as set forth in claim 4, wherein a film capable of forming an eutectic material at a temperature lower than a gold (Au)/silicon (Si) eutectic temperature is disposed on the surface of the bonding layer of the cap forming wafer; and the bonding step is to bond the bonding frame of the semiconductor wafer and the bonding layer of the cap forming wafer through the intermediary of this film.

8. A method as set forth in claim 4, wherein:
the bonding frame forming step comprises a step of sequentially forming a metal film capable of reducing a silicon oxide film and an anti-oxidation film capable of preventing oxidation of the metal film on the surface of the bonding layer of the cap forming wafer; and
the bonding step is to bond the bonding frame of the semiconductor wafer and the bonding layer of the cap forming wafer with the metal film and the anti-oxidation film intervening therebetween.

9. A method as set forth in claim 1, further comprising steps of adhering the cap forming wafer to a wafer support member, making cuts for the division and formation of the cap forming wafer into caps in chip units, bonding the cap forming wafer and the semiconductor wafer, and thereafter separating the wafer support member from the cap forming wafer to thereby remove unnecessary portions of the cap forming wafer.

10. A method as set forth in claim 1, wherein the bonding step is performed in an atmosphere of vacuum or inert gas or under a prescribed level of pressure to thereby make the interior of the cap have an atmosphere of vacuum or inert gas or a prescribed level of pressure.

11. A method as set forth in claim 1, wherein cutting of the semiconductor wafer at the predetermined position where this semiconductor wafer is to be divided and cutting of the cap forming wafer are both performed by a cutter being applied thereto from a side of the cap forming wafer.

12. A method for manufacturing a semiconductor device including a semiconductor wafer having a functional element formed on a surface thereof and a cap covering the functional element with a spatial portion being provided with respect to this functional element on the surface of the semiconductor wafer, comprising:

a functional element forming step of forming a plurality of functional elements on the semiconductor wafer for the formation of the functional elements;

a bonding frame forming step of forming a bonding frame in a region surrounding each functional element on the surface of the semiconductor wafer and on a side nearer by a prescribed distance to the functional element than to the predetermined position of the semiconductor wafer at which this semiconductor wafer is to be divided;

a bonding step of bonding a cap forming wafer having a leg portion at a position corresponding to the bonding frame pattern, onto the semiconductor wafer by making bondage between the leg portion and the bonding frame; and a cutting step of cutting the semiconductor wafer at the predetermined position thereof at which this semiconductor wafer is to be divided and also cutting the cap forming wafer at a cutting position on a side nearer to the bonding frame than to the position of the cap forming wafer that opposes the predetermined position of the semiconductor wafer at which this semiconductor wafer is to be divided.

13. A method for manufacturing a semiconductor device including a semiconductor wafer having a functional element formed on a surface thereof and a cap covering the functional element with a spatial portion being provided with respect to this functional element on the surface of the semiconductor wafer, comprising:

a first step of patterning a bonding frame consisting of a silicon thin film around a region for the formation of the functional element on a surface of the semiconductor wafer for the formation of the functional element and patterning a bonding layer consisting of a gold (Au) film at a position of the cap forming wafer that corresponds to the bonding frame pattern;

a second step of heating up to a temperature higher than a gold/silicon eutectic temperature in a state wherein the bonding frame of the semiconductor wafer and the bonding layer of the cap forming wafer are in contact with each other to thereby bond the bonding frame of the semiconductor wafer and the bonding layer of the cap forming wafer; and a third step of dicing the semiconductor wafer in chip units.

14. A method as set forth in claim 13, wherein the cap has a leg portion at a position corresponding to a region surrounding the functional element formation region; and the cap forming wafer in the second step has the bonding layer formed at a forward end surface of the leg portion.

15. A method as set forth in claim 13, further comprising a step of disposing the gold film becoming the bonding layer on an inner surface of the cap as an electromagnetic shielding layer.

16. A method as set forth in claim 13, in which the functional element includes a bridged beam structure of movable gate electrode consisting of a silicon thin film, a fixed source electrode and a fixed drain electrode, and which further comprises a step of forming the bonding frame simultaneously with the formation of the movable gate electrode.

17. A method as set forth in claim 13, wherein a film capable of forming an eutectic material at a temperature lower than a gold/silicon eutectic temperature is disposed on the surface of the bonding layer of the cap forming wafer; and the second step comprises a step of bonding the bonding frame of the semiconductor wafer and the bonding layer of the cap forming wafer through the intermediary of this film.

18. A method as set forth in claim 13, wherein the second step comprises a step of providing a metal anti-diffusion layer between the cap forming wafer consisting of silicon and the bonding layer and thereafter making bondage between the bonding frame of the semiconductor wafer and the bonding layer of the cap forming wafer.

19. A method as set forth in claim 13, further comprising steps of adhering the cap forming wafer to a wafer support member, making cuts for the division and formation of the cap forming wafer into caps in chip units, bonding the cap forming wafer and the semiconductor wafer, and thereafter separating the wafer support member from the cap forming wafer to thereby remove unnecessary portions of the cap forming wafer.

20. A method as set forth in claim 13, wherein wafer bonding in the second step is performed in an atmosphere of vacuum or inert gas or under a prescribed level of pressure to thereby make the interior of the cap have an atmosphere of vacuum or inert gas or a prescribed level of pressure.

* * * * *